(12) United States Patent
Gai

(10) Patent No.: US 6,246,294 B1
(45) Date of Patent: Jun. 12, 2001

(54) SUPPLY NOISE IMMUNITY LOW-JITTER VOLTAGE-CONTROLLED OSCILLATOR DESIGN

(75) Inventor: Weixin Gai, Santa Clara, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/249,490

(22) Filed: Feb. 12, 1999

(51) Int. Cl.$^7$ ............................................. H03L 1/00
(52) U.S. Cl. ............................. 331/57; 331/25; 331/175
(58) Field of Search ............................. 331/57, 25, 175

(56) References Cited

U.S. PATENT DOCUMENTS

| | | | |
|---|---|---|---|
| 5,180,995 | 1/1993 | Hayashi et al. | 331/57 |
| 5,532,636 | 7/1996 | Mar et al. | 327/543 |
| 5,686,867 | * 11/1997 | Sutardja et al. | 331/57 |
| 5,847,616 | * 12/1998 | Ng et al. | 331/57 |
| 5,959,502 | * 9/1999 | Ovens et al. | 331/8 |

OTHER PUBLICATIONS

Hayes, T. C., Horowitz, P., "Student Manual for the Art of Electronics," Cambridge University Press, Chapter 9, pp. 406–430, 1989.

Horowitz, P., Hill, W., "The Art of Electronics," Cambridge University Press, Second Edition, Chapter 9, pp. 641–655, 1989.

\* cited by examiner

*Primary Examiner*—Arnold Kinkead
(74) *Attorney, Agent, or Firm*—Fenwick & West LLP

(57) ABSTRACT

A phase-locked loop system that generates an output signal having low jitter includes a phase frequency detector, a charge pump, a low jitter voltage-controlled oscillator, a system low-pass filter, and a divider. The phase frequency detector couples to an input signal line. The charge pump couples to the phase frequency detector, the low jitter voltage controlled oscillator, and the low pass filter. The low-jitter voltage controlled oscillator couples to an output signal line and to the divider. The divider couples to the phase frequency detector through a feedback signal line. The low jitter voltage controlled oscillator includes a voltage regulator, a low-pass filter, and a ring oscillator. The low jitter voltage controlled oscillator may also include a current driver. The voltage regulator couples to the low-pass filter and to the input signal line. The low-pass filter couples to the optional current driver and the ring oscillator. The ring oscillator couples to the charge pump, the optional low pass filter, the output signal line, and the divider. A method also discloses generating a low jitter output signal using a supply noise immunity low jitter voltage controlled oscillator.

8 Claims, 7 Drawing Sheets

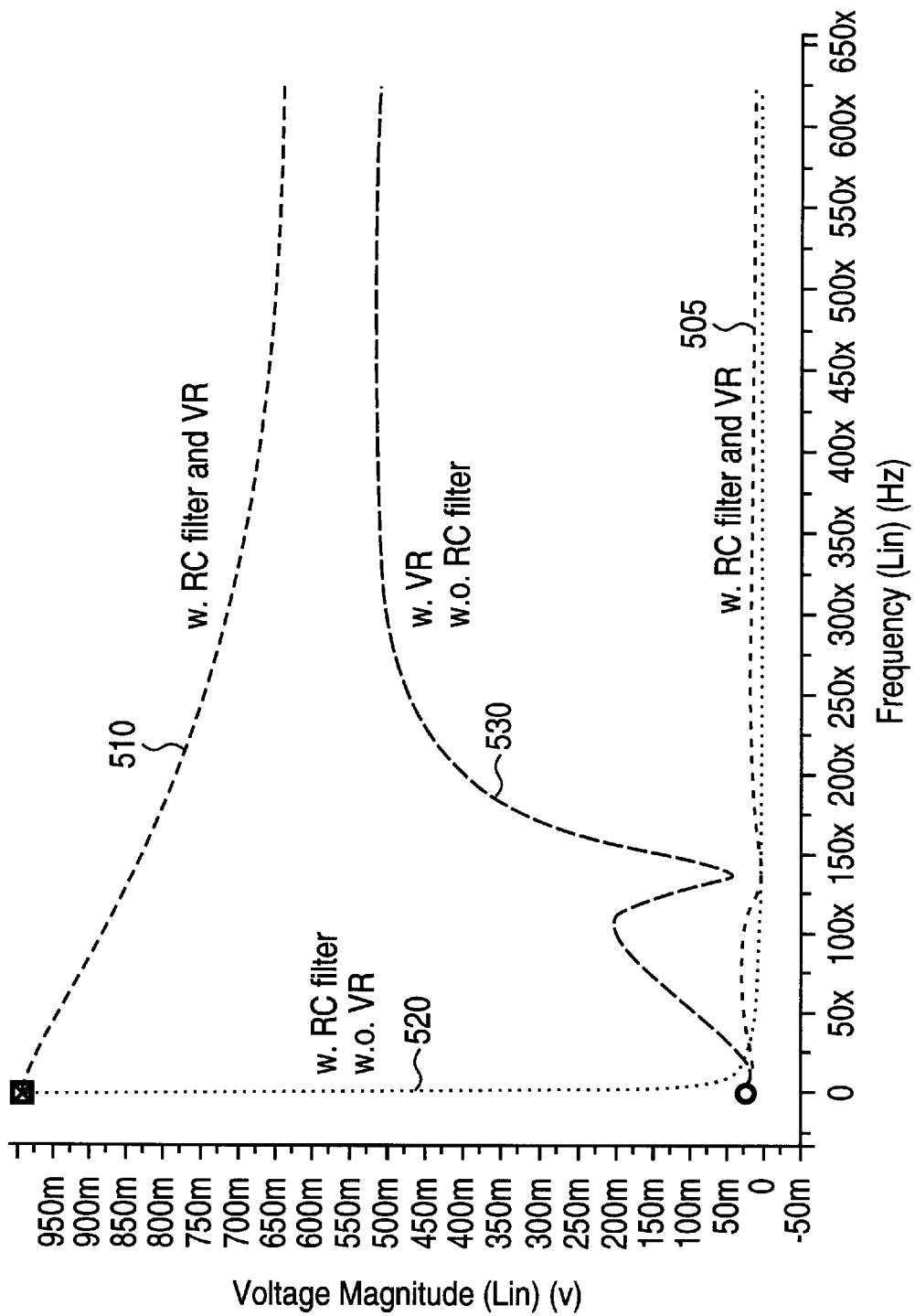

SUPPLY NOISE IMMUNITY LOW-JITTER VOLTAGE-CONTROLLED OSCILLATOR DESIGN

BACKGROUND OF THE INVENTION

1. Field of the Invention

The present invention relates to oscillator systems, and more specifically, to voltage-controlled oscillator of phase locked loop systems.

2. Description of the Related Art

Phase-locked loop circuits are known. Phase-locked loop circuits are used to provide a clock signal in conventional integrated circuit chips. Conventional phase-locked loop circuits include a conventional phase detector, a conventional amplifier, and a conventional voltage controlled oscillator. The conventional phase detector is coupled to the conventional amplifier. The conventional amplifier is coupled to the conventional oscillator.

The conventional phase detector compares two frequency signals to determine if they are equal. If they are equal, the voltage controlled oscillator locks in to a frequency of the input signal. If the two signals are not equal, the conventional phase detector generates a phase error signal that is amplified and sent to the voltage controlled oscillator. The voltage controlled oscillator uses this signal to deviate the frequency of its signal towards the frequency of the input signal.

As the speed of integrated circuit chips increases the conventional phase-locked loop circuit becomes more and more unreliable. For example, cycle-to-cycle jitter in the signal output from the voltage controlled oscillator increases. Most of this jitter results from sources within the phase-locked loop circuit. For example, in a deep sub-micron process, digital circuitry in the ultra large scale integration system makes the supply voltage particularly noisy.

Further, a problem with conventional phase-locked loop circuits is that they are unreliable in high frequency applications. Severe jitter is unacceptable in such applications. The jitter that results in a high performance system causes errors in the generated system clock and inaccuracies in clocked data. This results in a decrease in overall system speed and efficiency.

In conventional phase-locked loop circuits, there may be numerous sources of jitter. For example, one source of jitter is supply voltage noise from sources such as the conventional voltage controlled oscillator in the phase locked-loop circuit. Another source of jitter is the intrinsic noise in field effect transistors used in the phase-locked loop circuit. Still another source of noise is the noise coupling onto the controlled voltage from a phase detector or low-pass filter. Each source of jitter increases the overall jitter in the system.

Therefore, there is a need for a phase-locked loop system and a method that (1) is suitable for deep sub-micron process, (2) generates a clock signal with reduced supply voltage noise sensitivity in high frequency applications; and (3) includes a supply voltage noise immunity low jitter voltage controlled oscillator.

SUMMARY OF THE INVENTION

A system and a method of the present invention include a phase-locked loop (PLL) system and method for generating a clock signal having a low jitter characteristic. A phase-locked loop system that generates an output signal having low jitter includes a phase frequency detector, a charge pump, a PLL low-pass filter, a low jitter voltage-controlled oscillator, and a divider.

The phase frequency detector is coupled to an input signal line. The charge pump couples to the phase frequency detector, the low jitter voltage controlled oscillator, and the PLL low pass filter. The low jitter voltage controlled oscillator couples to an output signal line and to the divider. The divider couples to the phase frequency detector through a feedback signal line.

Further, the low jitter voltage controlled oscillator includes a voltage regulator, a VCO low-pass filter, and a ring oscillator. The low jitter voltage controlled oscillator may also include a current driver. The voltage regulator couples to the low-pass filter and to the input signal line. The VCO low-pass filter couples to the optional current driver and the ring oscillator. The ring oscillator couples to the charge pump, the PLL low pass filter, the output signal line, and the divider.

The input signal includes an input frequency and an input phase. The phase frequency detector receives the input signal and compares the input phase with a feedback phase of a feedback signal from the divider. If the input phase is before the feedback phase, the phase frequency detector generates an up signal. If the input phase is after the feedback phase, the phase frequency detector generates a down signal.

The charge pump receives the up signal or the down signal. If the up signal is received, the charge pump gradually increases a controlled voltage signal that is transmitted to the low jitter voltage controlled oscillator. If the charge pump receives the down signal, the charge pump gradually decreases the controlled voltage signal transmitted to the low jitter voltage controlled oscillator.

The ring oscillator of the low jitter voltage controlled oscillator receives the increasing or decreasing controlled voltage signal from the charge pump. In the voltage controlled oscillator, the voltage regulator receives a reference voltage signal. The voltage regulator uses the reference voltage to generate a voltage regulator signal that is a regulated supply voltage. This supply voltage may have a frequency that matches the frequency of the input signal. The voltage regulator reduces the low frequency supply noise in the regulated supply voltage. The regulated supply voltage passes through the low-pass filter, which filters out the high frequency noise. The resulting signal is a clean voltage supply signal, ACVDD.

The clean voltage supply signal is a DC voltage. The clean voltage supply signal may be a drive signal that assists in driving the ring oscillator. The optional driver current course may also provide an additional current source for the drive signal. The drive signal is received by each differential delay stage of the ring oscillator. The ring oscillator also receives the increasing or decreasing controlled voltage signal. The result is that if the ring oscillator receives an increasing controlled voltage signal, it generates an output signal having an increasing frequency, $f_o$. If the ring oscillator receives a decreasing controlled voltage signal, it generates an output signal having a decreasing frequency, $f_o$. A use of the output signal is as a clock signal having low jitter.

The present invention is beneficially used in high performance electrical systems. For example, the present invention advantageously may be operated at a broad frequency range so that a clock signal having low jitter characteristics may be generated. The low jitter clock signal increases system performance because the system may lower the time period it must budget for signal jitter.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

FIG. 5 is a graphical diagram illustrating one embodiment of the relationship between a voltage magnitude for noise and frequency in an output signal generated in accordance with the present invention.

DETAILED DESCRIPTION OF THE PREFERRED EMBODIMENTS

Figure 1A:
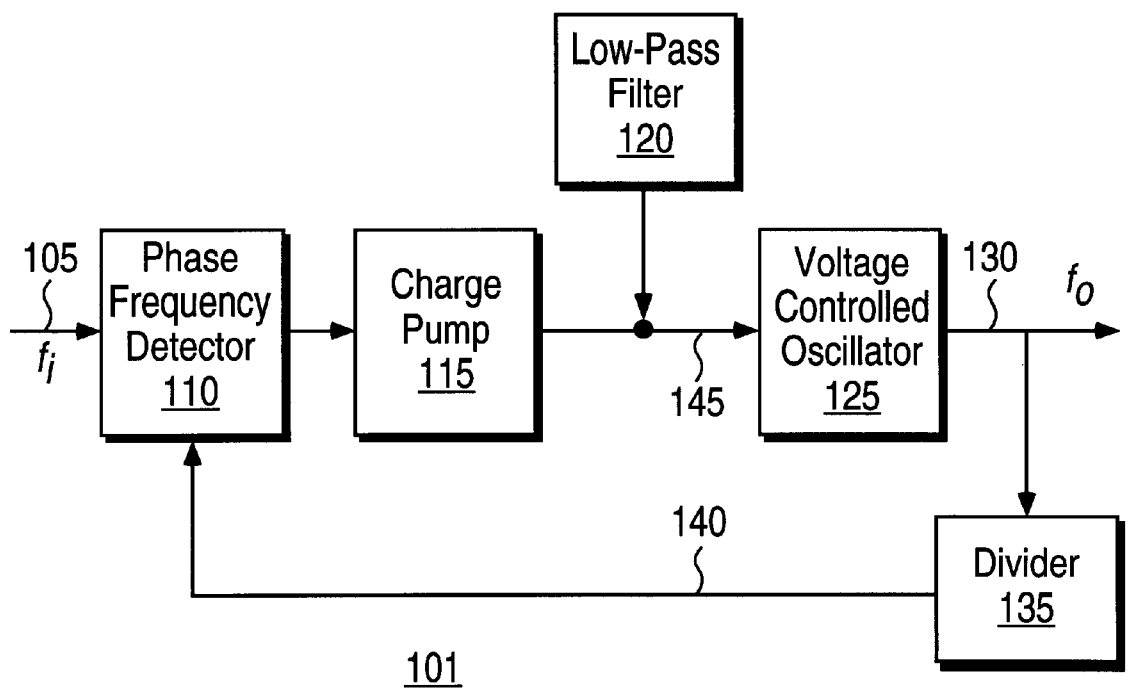
FIG. 1a is a block diagram illustrating one embodiment of a phase-locked loop system in accordance with the present invention.

A preferred embodiment of the present invention will be described with reference to the Figures, where like reference numbers may indicate identical or functionally similar elements. The present invention includes a system and a method for generating a low jitter output signal that may, for example, be a clock signal that is suitable for use in high performance electrical systems.

FIG. (FIG. ) 1a is a block diagram illustrating one embodiment of a phase-locked loop (PLL) system 101 in accordance with the present invention. The phase-locked loop system 101 may be used in high performance electrical systems, for example, a high speed communication integrated circuit chip such as a router or a high speed processor integrated circuit chip. Moreover, the phase-locked loop system 101 may be used to generate an output signal, for example, a low-jitter, clock signal having a broad frequency range (e.g., from a few hertz (Hz) to many gigahertz (GHz)) in the high performance electrical signal.

The phase-locked loop system 101 includes an input signal line 105, a phase frequency detector 110, a charge pump 115, a PLL low-pass filter 120, a low-jitter voltage controlled oscillator system 125, an output signal line 130, a divider 135, a feedback signal line 140, and a controlled voltage signal line 145. The input signal 105 couples to the phase frequency detector 110. The phase frequency detector couples to the charge pump 115. The charge pump 115 couples to the PLL low-pass filter 120 and the low-jitter voltage controlled oscillator 125 through the controlled voltage signal line 145. The controlled voltage signal line couples to the output signal line 130. The divider 135 also couples to the output signal line 130 and to the phase frequency detector 110 through the feedback signal line 140.

Figure 1B:
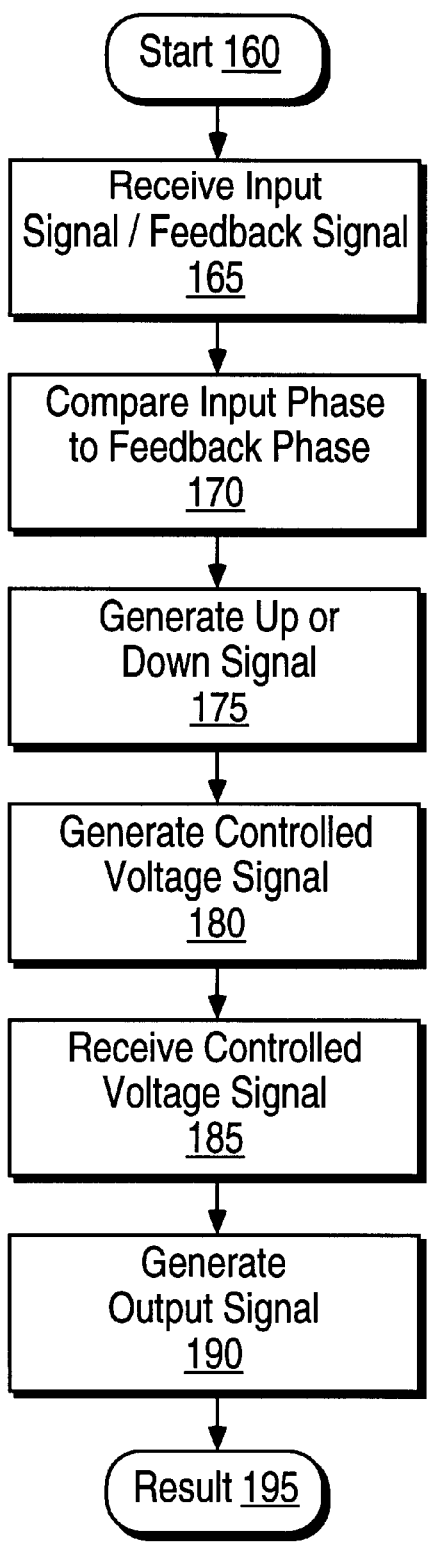
FIG. 1b is flow diagram illustrating one embodiment of a process for generating an output signal from a phase-locked loop system in accordance with the present invention.

FIG. 1b is flow diagram illustrating one embodiment of a process for generating an output signal from a phase-locked loop system, for example, the phase-locked loop system 101, in accordance with the present invention. At the start 160 of the process, the phase frequency detector 110 receives 165 an input signal from along the input signal line 105. The input signal, $F_{in}$, has an input frequency value, $f_{in}$, and an input signal phase value.

In a preferred embodiment, the input signal $F_{in}$ has a frequency, $f_{in}$, of 62.5 MHz. The phase frequency detector 110 also receives 165 a feedback signal from the divider 135. The feedback signal, $F_{fb}$, has a feedback frequency value, $f_{fb}$, and a feedback signal phase value. When the output signal is locked by the phase-locked loop system 101, the feedback signal may be at a frequency, $f_{fb}$, that is substantially equal to the input frequency, $f_{in}$.

The phase frequency detector 110 compares 170 the phase difference between the input signal phase of the input signal and the feedback signal phase of the feedback signal. If the time period of the input phase is before the feedback phase, the phase frequency detector 110 generates 175 an up (increase) signal. If the input signal phase is after the feedback signal phase, the phase frequency detector 110 generates 175 a down (decrease) signal.

The charge pump 115 receives the up signal or the down signal from the phase frequency detector 110. If the charge pump 115 receives the up signal, it generates 180 an increasing controlled voltage signal. If the charge pump 115 receives the down signal, it generates 180 a decreasing controlled voltage signal. The increasing or decreasing controlled voltage signal may be passed through the PLL low-pass filter 120. The PLL low-pass filter 120 helps stabilize the increasing controlled voltage signal towards a supply rail voltage, e.g., $V_{DD}$, or the decreasing controlled voltage signal towards ground. The low-pass filter 120 suppresses high frequency noise, allowing a DC value for controlling the voltage controlled oscillator frequency.

The low-jitter voltage controlled oscillator 125 receives 185 the increasing or decreasing controlled voltage signal from the low-pass filter 120 or the charge pump 115, through the controlled voltage signal line 145. If the low-jitter voltage controlled oscillator 125 receives 185 the increasing controlled voltage signal, it generates an output signal having an increasing frequency. If the low-jitter voltage controlled oscillator 125 receives 185 the decreasing controlled voltage signal, it generates an output signal having a decreasing frequency.

The result 195 from the process is that the low-jitter voltage controlled oscillator 125 advantageously allows for the generation of a high frequency output signal having very low jitter. The output signal may have a frequency of $f_o$ may be, for example, 625 MHz, although those skilled in the art should recognize that the output frequency may be any other value. The output signal may also have an associated phase value. This output signal may be used for supplying a high frequency clock signal to other components in an electrical system, for example, a high performance communication integrated circuit or a high performance processor integrated circuit.

In addition, the divider 135 also receives the output signal. The divider may be a divide by n counter, where n may be a digital value. The divider divides the output frequency to increase it. This serves to synthesize the feedback frequency so that $f_{fb}=xf_o$, along with some feedback phase value, where x is equal to (1/n). It is noted that the feedback frequency is increased by the divider because conventional systems cannot directly input a high frequency clock signal from an external clock.

It is noted that the low-pass filter 120 may be a first order or a second order low-pass filter. In a preferred embodiment the low-pass filter 120 is a passive two-pole, one-zero low-pass filter. It includes a resistor and a plurality of capacitors. The frequency response of the low-pass filter 120 is only limited by the size of the resistor and the capacitors. The low-pass filter may be operated as a first-order low-pass filter and may include a smoothing capacitor at a frequency that is at least a decade above a first-order pole. The low-pass filter is particularly beneficial in a MOS based version of the phase-locked loop system 101 due to its flexible design and properties.

Figure 2:
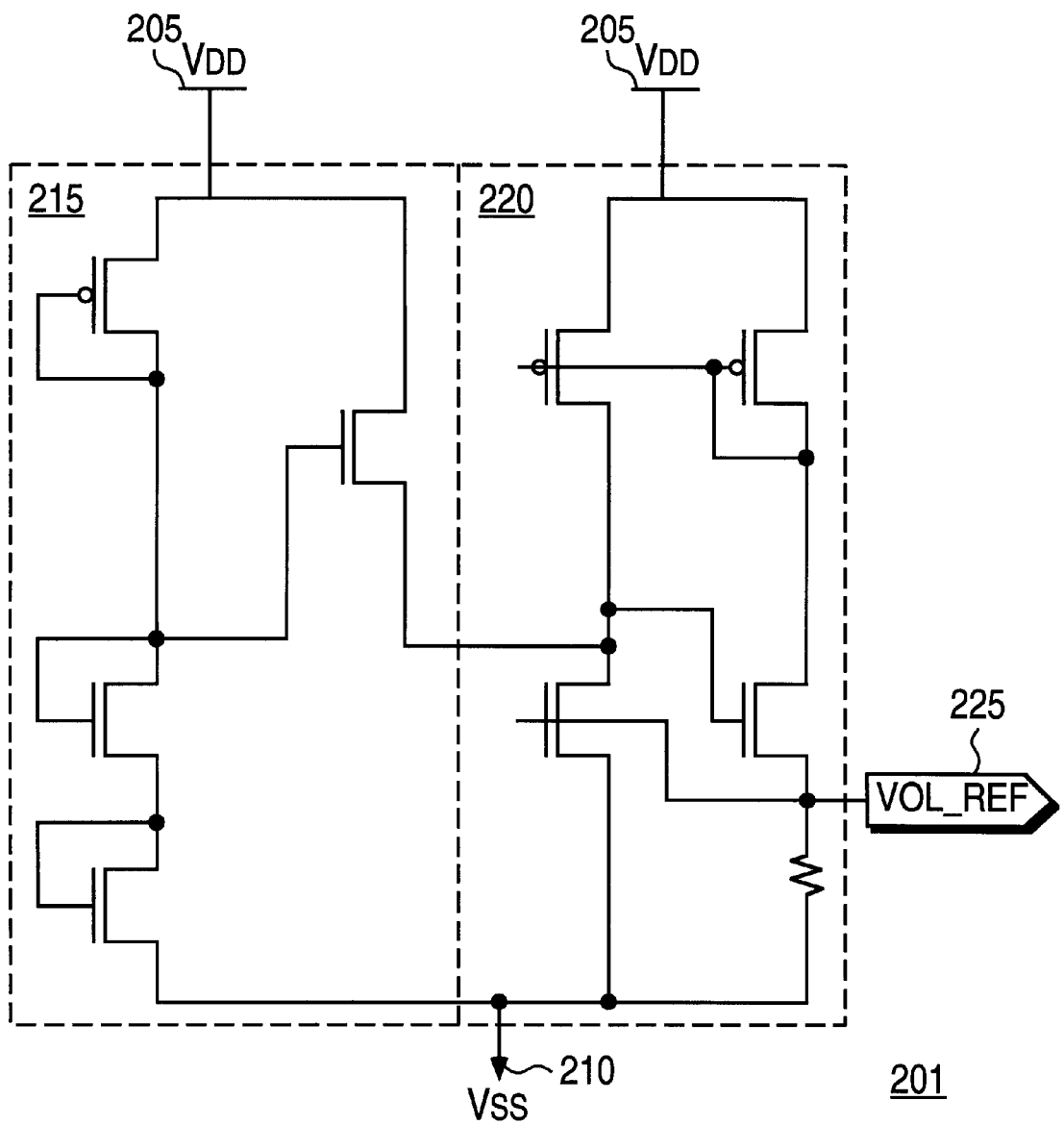
FIG. 2 is a circuit diagram illustrating one embodiment of a reference voltage source in accordance with the present invention.

Referring now to FIG. 2, a circuit diagram illustrates one embodiment of a reference voltage source 201 in accordance with the present invention. The reference voltage source 201 employs a CMOS threshold voltage reference. The reference voltage source 201 includes a start-up subcircuit 215 and a reference subcircuit 220. The start-up subcircuit 215 and the reference subcircuit 220 are coupled through a supply voltage rail $V_{DD}$ 205 and a second (source) voltage rail $V_{SS}$. Further, the reference subcircuit 220 is coupled to the reference voltage signal line 225. The reference voltage signal from the reference voltage signal line is sent to a voltage regulator, such as the one described below with regard to FIG. 5.

The supply voltage rail $V_{DD}$ may have a system supply voltage of $V_{DD}$ equal to, for example, 2.5 volts. The second voltage rail $V_{SS}$ may have a voltage of $V_{SS}$ equal to, for example, ground. The start-up subcircuit 215 sets a normal direct current ("DC") working point for the reference voltage source 201. The reference subcircuit 220 then is able to generate a reference voltage signal of Vref volts along the reference voltage signal line 225. In one embodiment, the reference voltage signal is a 1.0 volt DC signal.

It is noted that in an alternative embodiment, the reference voltage source may couple to a voltage supply rail that provides a "clean" supply voltage, ACVDD. The clean voltage supply is further described below with regard FIG. 4a. The reference voltage source 201 provides a good supply immunity of the reference voltage in the phase-locked loop system 101. This advantageously reduces or eliminates another source of jitter within the phase-locked loop system 101.

Figure 3:
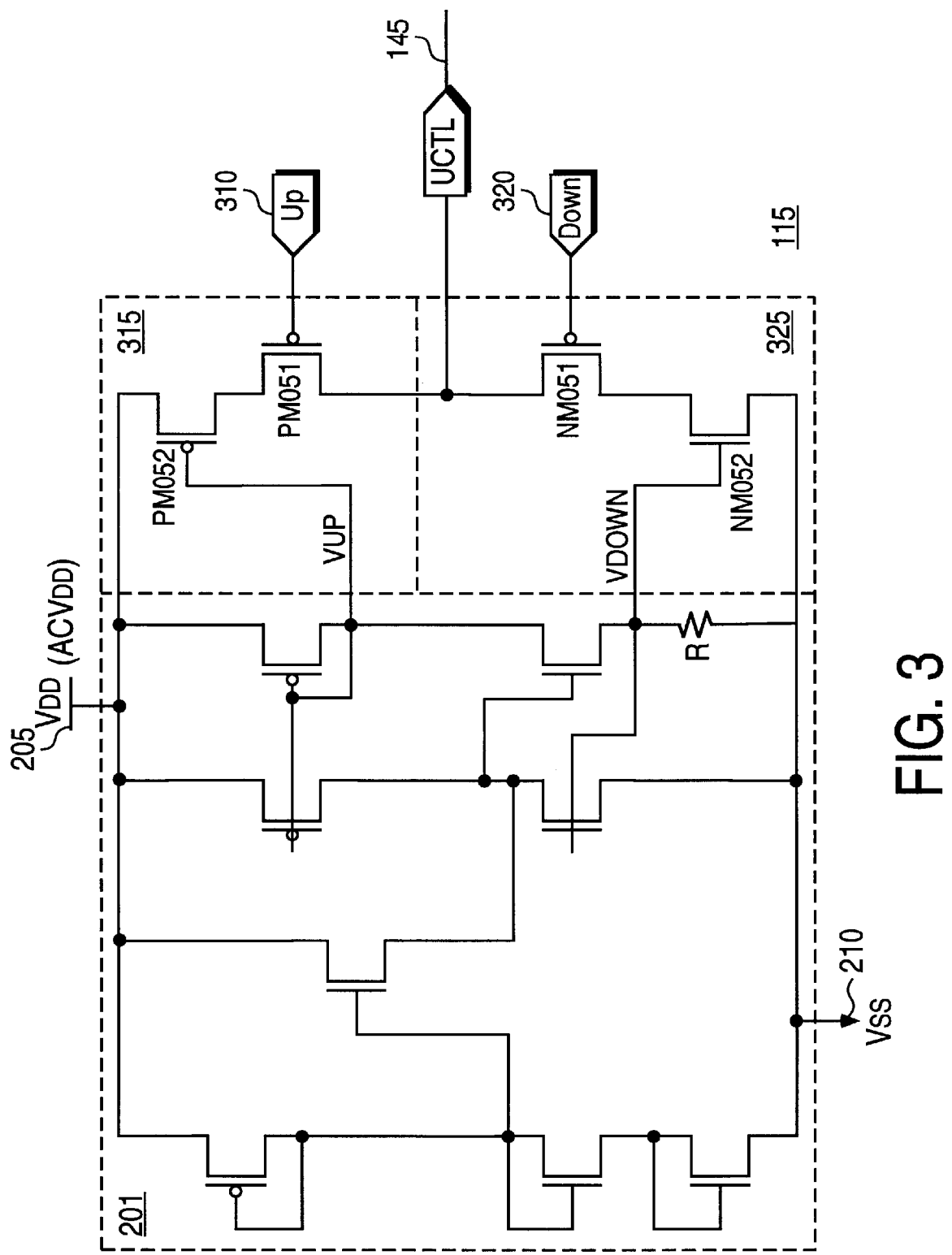
FIG. 3 is a circuit diagram illustrating one embodiment of a controlled voltage source in accordance with the present invention.

Turning to FIG. 3, a circuit diagram illustrates one embodiment of the charge pump 115 (controlled voltage source), in accordance with the present invention. The charge pump 115 includes two current mirrors and a reference voltage source, for example, the reference voltage source 201. The current mirrors couple to the reference voltage source 201. The current mirrors may be referred to as a pull-up subcircuit 315 and a pull down subcircuit 325. The pull-up subcircuit 315 and the pull-down subcircuit 325 couple through the supply voltage rail 205 and the second voltage rail 210 (which couple to the reference voltage source 201), as well as the controlled voltage signal line 145.

The pull-up subcircuit 315 includes a set of PMOS transistors that function in a conventional manner. One PMOS transistor couples to the up signal line 310, a second PMOS transistor, and the pull-down subcircuit 325. The second PMOS transistor couples to the reference voltage source 201. The pull-down subcircuit 315 includes a set of NMOS transistors that function in a conventional manner. One NMOS transistor couples to the down signal line 320, a second NMOS transistor, and the pull-up subcircuit 315. The second NMOS transistor couples to the reference voltage source 201.

The system supply voltage rail 205 voltage (or alternatively the clean supply voltage, ACVDD) and the second voltage rail 210 serve as references to ensure that equal up currents and down currents are generated by the current mirrors, i.e., the pull-up subcircuit 315 and the pull-down subcircuit 325. The pull-up subcircuit 315, which couples to an up signal line 310, receives the up signal from the phase frequency detector 110.

When the charge pump 115 receives the up signal, it generates a charge current to charge a node VCTL. Specifically, the charge pump 115 produces an increasing controlled voltage through node VCTL. The voltage at VCTL may be an analog voltage. The pull-down subcircuit 325, which couples to a down signal line 320, receives the down signal from the phase frequency detector 110. When the charge pump 115 receives a down signal, it generates a discharge current to discharge node VCTL. Specifically, the charge pump 115 produces a decreasing voltage through node VCTL. The voltage at VCTL may be an analog voltage.

An advantageous feature of the charge pump 115 is that it may operate with the clean supply voltage, ACVDD. Using a clean supply voltage, rather than a conventional power supply voltage, reduces a source of noise in the phase-locked loop system 101. Another advantage of the charge pump 115 is that it allows for a charge current and a discharge current to be substantially the same, or constant. Moreover, this design may be universally applied for a variety of processing, including fast or slow NMOS and fast or slow PMOS.

Figure 4A:
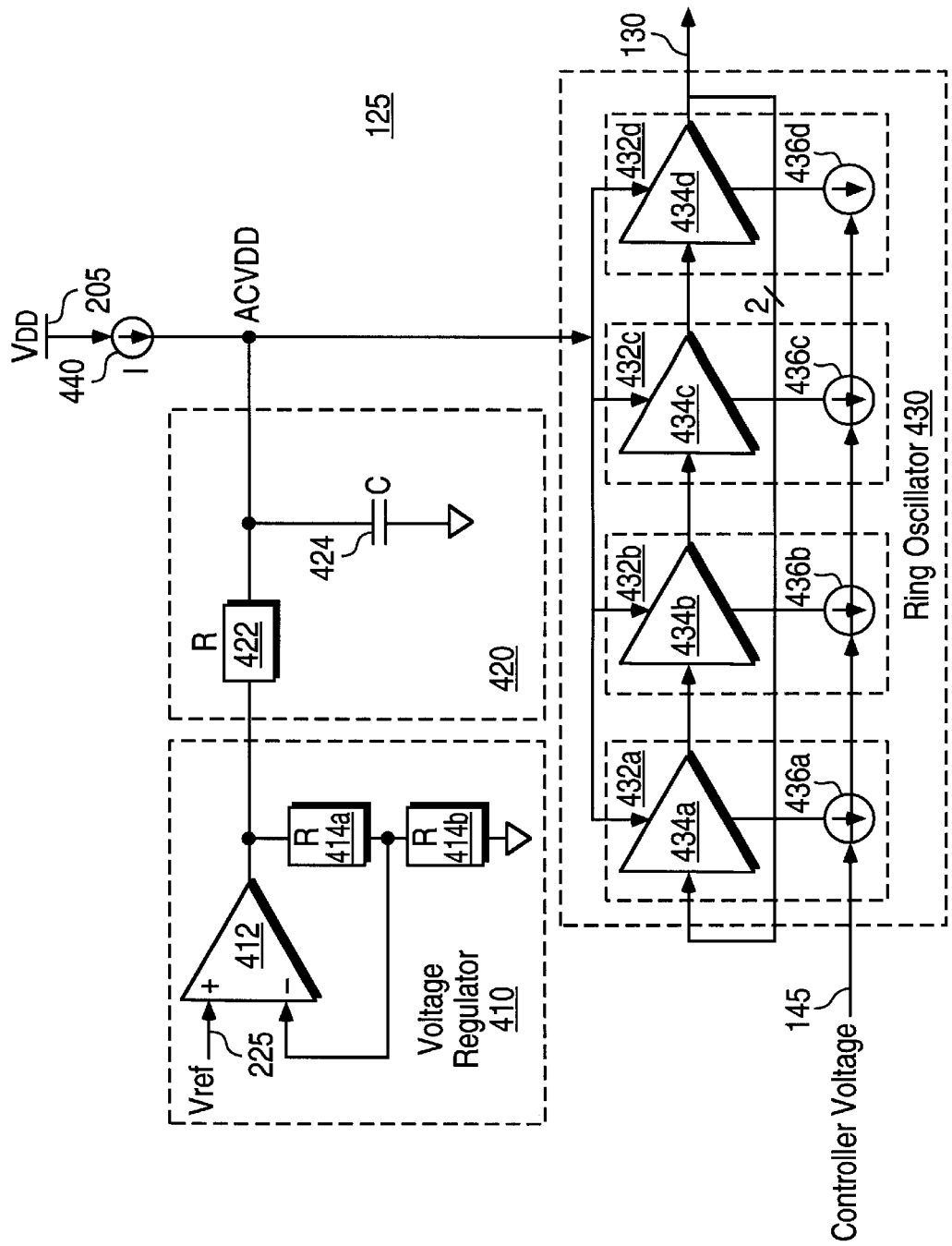
FIG. 4a is a block diagram illustrating one embodiment of a low jitter voltage controlled oscillator system in accordance with the present invention.

FIG. 4a is a block diagram illustrating one embodiment of a low-jitter voltage controlled oscillator (VCO) system 125 in accordance with the present invention. The voltage controlled oscillator system 125 in accordance with the present invention includes a voltage regulator 410, a low-pass filter 420, and a ring oscillator 430. The voltage controlled oscillator system 125 may also include a current source 440.

The voltage regulator 410 couples to the low-pass filter 420. The low-pass filter 420 couples to the ring oscillator 430. The optional current source 440 couples to the system supply voltage rail 205 and the low-pass filter 420. The ring oscillator 430 couples to the optional current source 440, the controlled voltage signal line 145, and the output signal line 130.

The voltage regulator 410 includes an operational amplifier 412, and a first and a second resistor 414a, 414b (generally 414). The operational amplifier 412 includes a positive input, a negative input, and an output. The positive input couples to the reference voltage signal line 225. The output of the operational amplifier 412 couples to a first end of the first resistor 414a. A second end of the first resistor 414a couples to a first end of the second resistor 414b as well as the negative input of the operational amplifier 412. A second end of the second resistor 414b couples to a ground. In addition, the output of the operational amplifier 412 is coupled to the low-pass filter 420.

The low-pass filter 420 includes a capacitor 424 and may include a resistor 422. The capacitance value of the capacitor 424 may be decreased by increasing the resistance value of the optional resistor 422, thereby reducing the cost of the high pass filter 420. A first end of the capacitor 424 couples to the output of the voltage regulator 410 or a second end of the optional resistor 422. A first end of the optional resistor 422 couples to the output of the voltage regulator 410. The second end of the capacitor couples to ground. The first end of the capacitor 422 and the second end of the resistor 424 also couple to the current source 440 and the ring oscillator 430.

The ring oscillator 430 includes one or more differential delay stages 432, e.g., 432a–432d, that couples in series. In a preferred embodiment, the ring oscillator 430 includes four differential delay stages 432. Each differential delay stage 432 includes a differential delay element 434, e.g., 434a–434d, and a delay stage current source 436, e.g., 436a–436d. The differential delay element 434 couples to the delay stage current source 436 in each differential delay stage 432.

Figure 4B:
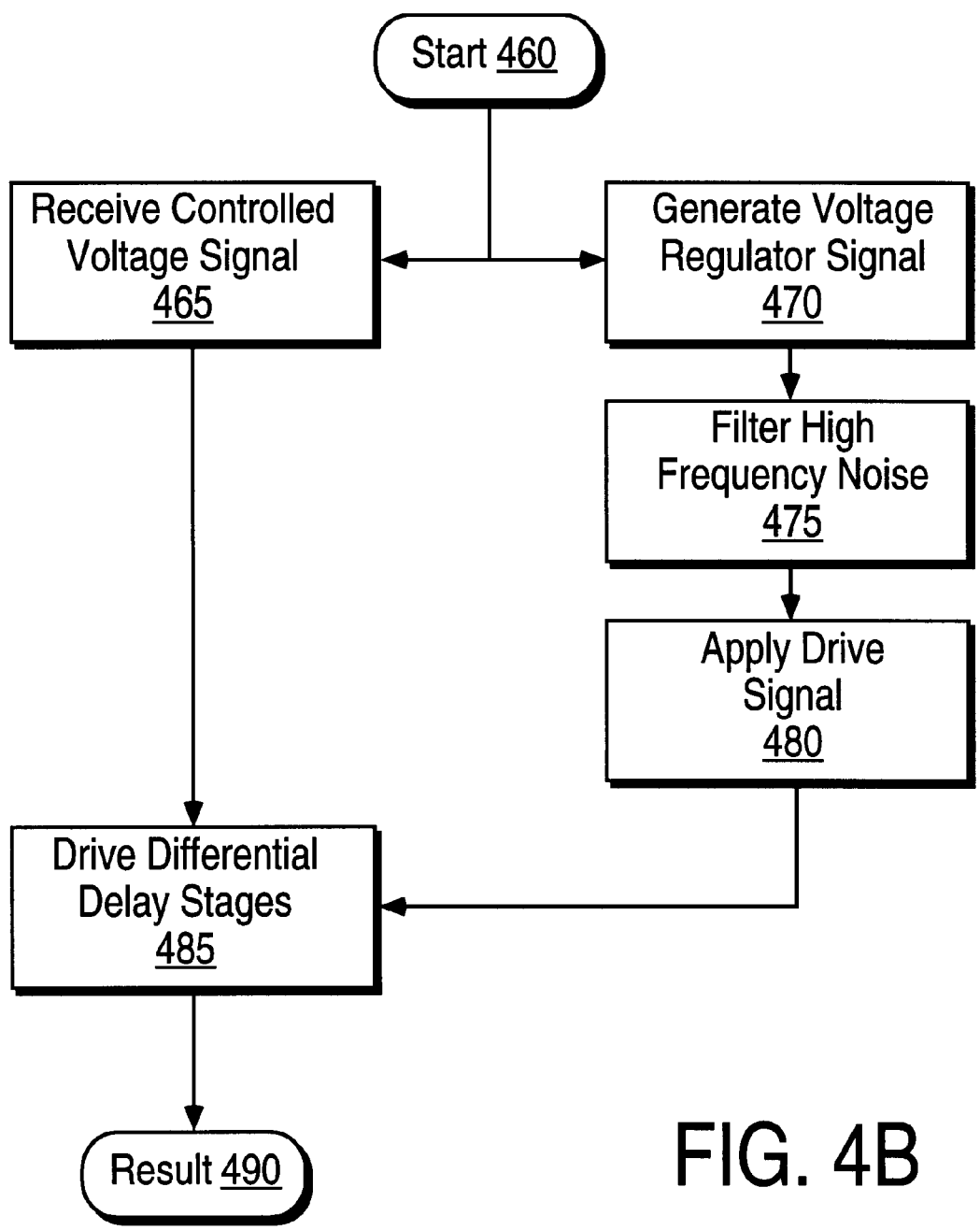
FIG. 4b is a flow diagram illustrating one embodiment of a process for generating an output signal from a low jitter voltage controlled oscillator system in accordance with the present invention.

FIG. 4b is a flow diagram illustrating one embodiment of a process for generating the output signal from a low-jitter voltage controlled oscillator system 125 in accordance with the present invention. Once the process starts 460, the ring oscillator 430 receives 465 the controlled voltage signal from along the controlled voltage signal line 145. Specifically, the differential delay current source 436a in each differential delay stage 432a–432d receives the controlled voltage signal.

Also as the process starts 460, the voltage regulator 410 receives a reference voltage signal from, for example, the reference voltage source 201. The process uses the reference voltage signal to generate 470 a voltage regulator signal. The voltage regulator signal filters is a supply voltage signal with low frequency noise filtered out. The low-pass filter 420 receives the voltage regulator signal and filters 475 out the high frequency noise. This results in a "clean" supply voltage signal, ACVDD, at a clean supply node (ACVDD).

The clean supply voltage signal may provide a "clean" supply signal, rather than a supply rail voltage signal ($V_{DD}$), for other components in the electrical system that couple to the system supply voltage rail 205, including, for example, the reference voltage source 201 and the charge pump 125. The clean supply voltage signal may also be a DC voltage drive signal for the ring oscillator 430.

The process applies 480 the clean voltage signal to the ring oscillator 430. The drive signal and the received 485 controlled voltage signal drives 485 each differential delay stage 432. The drive current source 440 may assist with the drive of the clean voltage signal by supplying additional drive current in the voltage controlled oscillator 125. The result 490 is that the process generates an output signal along the output signal line 130.

The output signal emerging from the ring oscillator has a frequency of $f_o$, along with some output signal phase value. In one embodiment, the frequency of the output signal is $f_o$ equal to 625 MHz, although those skilled in the art should recognize that other frequencies are possible. In addition, the output signal is an increasing frequency output signal or a decreasing frequency output signal depending on whether the voltage controlled oscillator receives an increasing controlled voltage or a decreasing controlled voltage signal. Moreover, the resulting output signal has low jitter and is beneficial for high performance applications in a broad range of frequencies.

The voltage controlled oscillator system 125 includes numerous benefits to advantageously reduce or eliminate jitter from the output signal. For example, using a dedicated voltage regulator 410 advantageously reduced the sensitivity of the voltage from the supply voltage rail 205. Further, the low-pass filter 420 advantageously reduces high frequency noise from the supply signal to generate the clean supply voltage signal. In addition, using the clean voltage signal with the differential delay stages 432 beneficially allows the voltage controlled oscillator system 125 to be less susceptible to power supply noise because it rejects common mode noise.

FIG. 5 is a graphical diagram illustrating one embodiment of the relationship between a voltage magnitude for noise and frequency in an output signal generated in accordance with the present invention. The phase-locked loop system 101, which includes the voltage regulator 410 and the low-pass filter (RC filter) 420 in accordance with the present invention, beneficially reduces or eliminates noise 505 from the output signal in a broad range of frequencies.

In systems that lack the voltage regulator 410 and the low-pass filter 420, the magnitude of the noise 510 in the output signal from the phase-locked loop remains consistently high at both lower and upper frequencies. In systems that lack the voltage regulator 410, but have the low-pass filter 420, the noise 520 in the output signal is extremely high at lower frequencies. In systems that include the voltage regulator 410, but lack the low-pass filter 420, the noise 530 in the output signal is low at lower frequencies, but is significantly higher at the upper frequencies.

The phase-locked loop system 101 offers numerous benefits and advantages for use in electrical systems such as high performance electrical systems. For example, the present invention advantageously operates at a broad spectrum of frequency ranges so that it generates a clock signal with low jitter. This low-jitter clock signal increases system performance because the system can use a lower time budget over to account for jitter from a clock signal.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A phase-locked loop system for generating an output signal having low jitter, the system comprising:

a phase frequency detector, coupled to receive an input signal having an input frequency and an input phase, for generating an up signal or a down signal;

a charge pump, coupled to the phase frequency detector, for generating a charging controlled voltage signal in response to receiving the up signal and for generating a discharging controlled voltage signal in response to receiving the down signal;

a voltage controlled oscillator, coupled to the charge pump, for generating an output signal that is rising in response to receiving the voltage charge signal and for generating an output signal that is falling in response to receiving the voltage discharge signal; and a divider, coupled to the voltage controlled oscillator and the phase frequency detector, for generating a feedback signal having a feedback phase, the phase frequency detector generating the up signal in response to the input phase being before the feedback phase and generating the down signal in response to the input phase being after the feedback phase, wherein the voltage controlled oscillator includes a voltage regulator, coupled to receive as input signals a reference voltage and an output signal of the voltage regulator through a feedback loop, for generating a voltage signal matching the input frequency, a low-pass filter, coupled to the voltage regulator, for producing a clean voltage signal, and a ring oscillator, coupled to the low-pass filter, for receiving the clean voltage signal and generating the output signal.

2. The phase-locked loop system in claim 1, wherein the voltage controlled oscillator further includes a current source, coupled to the low-pass filter and the ring oscillator, for providing a drive current to assist the clean voltage signal to drive the ring oscillator.

3. The phase-locked loop system in claim 2, wherein the low-pass filter includes a capacitor, coupled to a ground, and a resistor coupled to the voltage regulator, the current source, and the capacitor.

4. The phase-locked loop system in claim 1, wherein the charge pump includes a pull-up subcircuit for gradually increasing the charging controlled voltage signal.

5. The phase-locked loop system in claim 1, wherein the charge pump includes a pull-down subcircuit for gradually decreasing the discharging controlled voltage signal.

6. In a phase-locked loop system, a method for generating a clock signal having low jitter, the method comprising:

receiving an input signal having an input phase;

comparing the input phase of the input signal with a feedback phase of a feedback signal;

generating an up signal in response to the input phase being before the feedback phase and generating a down signal in response to the input phase being after the feedback phase;

generating an increasing controlled voltage signal in response to the up signal and generating a decreasing controlled voltage signal in response to the down signal;

passing at least one from the group of the increasing controlled voltage signal and the decreasing controlled voltage signal through a voltage controlled oscillator;

generating a supply voltage having a frequency matching the input signal and filtering high frequency from the supply voltage;

the voltage controlled oscillator delaying the passed increasing controlled voltage signal or the passed decreasing controlled voltage signal and receiving the supply voltage having supply noise substantially rejected to generate the clock signal having low jitter.

7. The method for generating the clock signal having low jitter in claim 6, further comprising dividing the clock signal to generate the feedback signal having the feedback phase.

8. The method for generating the clock signal having low jitter in claim 6, wherein the passing step further comprises generating a drive current to provide a current to assist drive to a ring oscillator in the voltage controlled oscillator.

* * * * *